United States Patent [19]
Peng

[11] Patent Number: 6,067,336
[45] Date of Patent: May 23, 2000

[54] CHARGE PUMP CIRCUIT

[75] Inventor: Yung-Chow Peng, Hsinchu, Taiwan

[73] Assignee: Winbond Electronics Corporation, Taiwan

[21] Appl. No.: 09/164,842

[22] Filed: Oct. 1, 1998

[51] Int. Cl.[7] .................................................. H03D 3/24
[52] U.S. Cl. ......................... 375/376; 327/148; 327/157; 327/536
[58] Field of Search ........................... 375/376; 327/147, 327/148, 157, 105, 108, 536

[56] References Cited

U.S. PATENT DOCUMENTS

| | | | |
|---|---|---|---|
| 5,192,916 | 3/1993 | Glass | 328/155 |
| 5,285,114 | 2/1994 | Atriss et al. | 307/264 |
| 5,473,283 | 12/1995 | Luich | 331/8 |
| 5,646,563 | 7/1997 | Kuo | 327/157 |
| 5,801,578 | 9/1998 | Bereza | 327/536 |

OTHER PUBLICATIONS

Howard C. Yang, Lance K. Lee, and Ramon S. Co, "A Low Jitter 0.3–165 MHz CMOS PLL Frequency Synthesizer for 3 V/5 V Operation" IEEE Jorunal of Solid–State Circuits, vol. 32, No. 4, Apr. 1997.

Primary Examiner—Stephen Chin
Assistant Examiner—Mohammad Ghayour
Attorney, Agent, or Firm—Fulbright & Jaworski L.L.P.

[57] ABSTRACT

A charge pump includes a constant current source, a charging field effect transistor (FET) and a discharging FET coupled to mirror a current in the constant current source, a first pair of switching transistors controlling a charging current flow between a charging path and a first standby path, a second pair of switching transistors controlling a discharging current flow between a discharging path and a second standby path, a first and a second pairs of transistors isolating output and input of the charge pump and keeping unchanged the drain voltages of the charging and the discharging FETs. The two pairs of switching transistors in conjunction with the two pairs of transistors act to keep the charging and the discharging currents always on. Accordingly, the switching performance of the disclosed charge pump is much better than prior arts without using current-steering amplifier and is capable of high frequency operation. In addition, charge feedthrough, jitters, and unbalanced output waveform is not going to be significant in the invention. Consequently, the invention provides a device-saving charge pump supplying matched up and down current pulse without charge feedthrough.

24 Claims, 6 Drawing Sheets

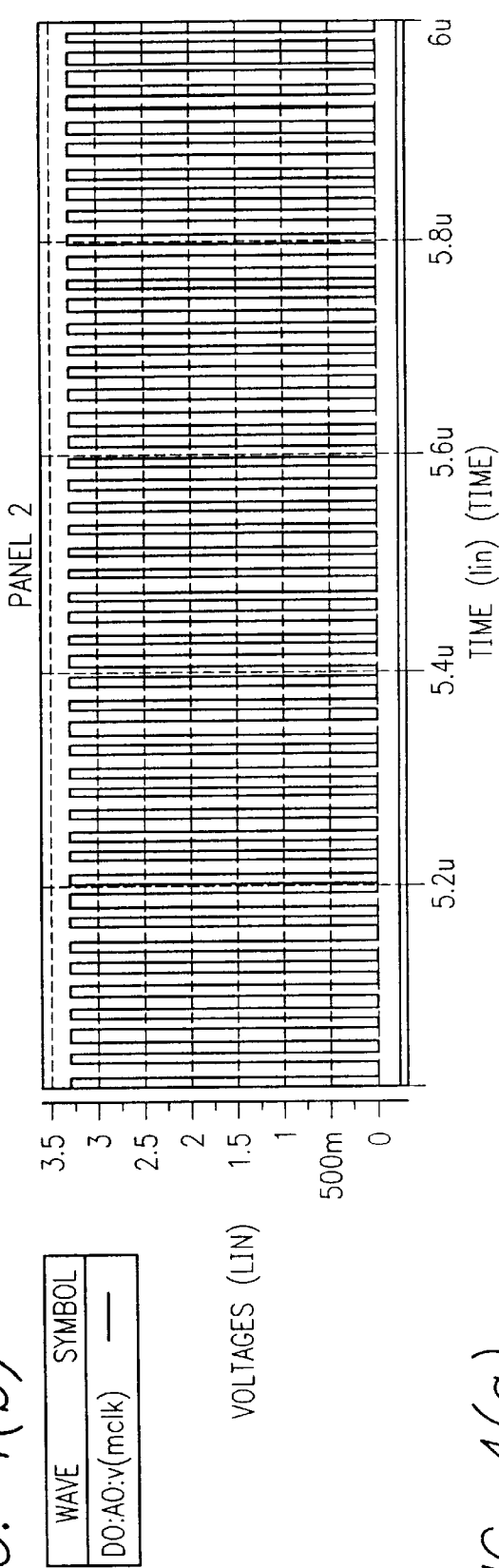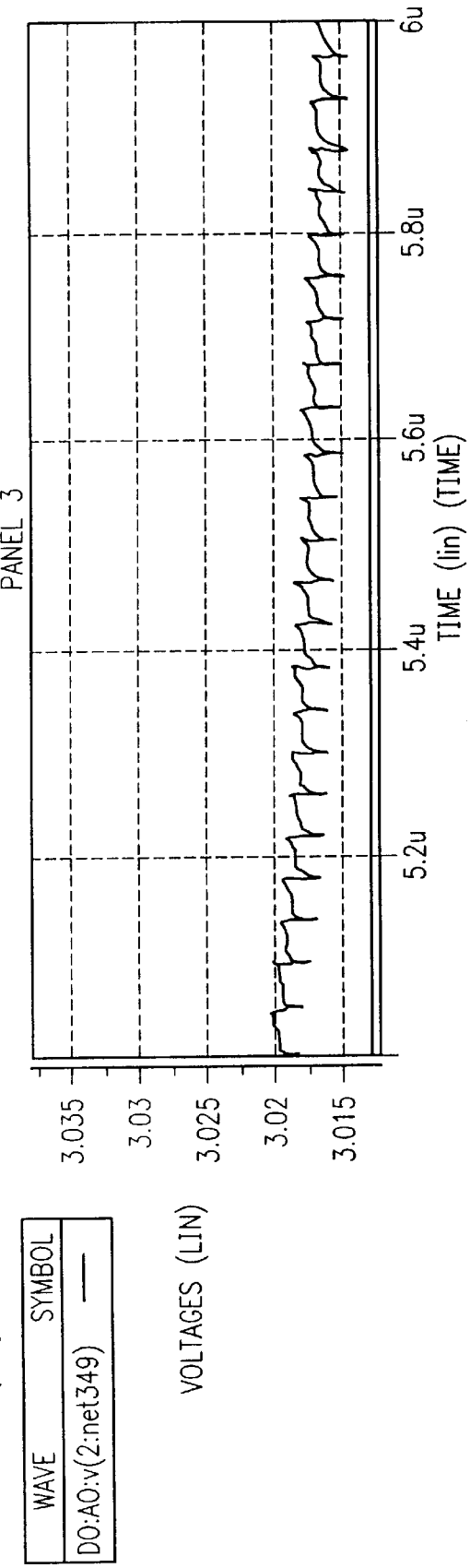
FIG. 4(b)
FIG. 4(a)

CHARGE PUMP CIRCUIT

BACKGROUND OF THE INVENTION

1. Field of the Invention

The present invention relates in general to charge pump, and more particularly to charge pump which experiences no charge feedthrough phenomenon during switching period.

2. Description of the Related Art

Charge pump is commonly utilized in phase-locked loops (PLL) to control a voltage applied to a voltage controlled oscillator (VCO). Therefore, charge pump is an important component of PLL as charge pump in many ways determines the maximum range and accuracy of lock frequencies for PLL. Further, charge pump may require a significant amount of semiconductor die space to implement and relatively high voltages to operate, thus increasing the overall size and power consumption of PLL. With the ever-increasing performance of microprocessors, much more stringent requirements have been placed on the design of phase-locked loop, and hence on the design of charge pump circuit. FIG. 1 shows a prior art phase-locked loop (PLL) 100 as generally comprising a phase detector 1 10, a charge pump 120, a loop filter 130, a voltage controlled oscillator 140, a frequency divider 150, a frequency divider 160, and a reference clock generator 170.

Phase detector 110 compares a reference input signal REF_IN, which may be provided by the reference clock generator 170 via the frequency divider 160, with a signal VCO_IN, which VCO 140 generates via the frequency divider 150. The phase detector 110 provides the control signals CNTRL_P and CNTRL_N for the transistors 122 and 128 of the charge pump 120, respectively. When the signal REF_IN and the signal VCO_IN are in phase, phase-locked loop 100 is locked, and the control signals CNTRL_P and CNTRL_N have matched duty cycles, phases, and frequencies.

The Charge pump 120 responds to the control signals CNTRL_P and CNTRL_N from the phase detector 110 and outputs a current Ic to the loop filter 130, which generally includes a large capacitor and averages the current Ic, to generate a DC voltage at the input of VCO 140. The loop filter 130 filters out the noise in the input signal to the filter 130.

In other words, voltage Vout depends on the current Ic to the loop filter 130. The current Ic, which is output at the node 125, is the difference between an up-current, Ip, into a node 125 and a down-current, In, out of the node 125. A transistor 122 turns on or off a current source 124 that supplies Ip and charges the node 125 and increases the voltage Vout. A transistor 128 turns on or off a current source 126 that supplies down-current, In, and discharges the node 125 and decreases the voltage Vout. Filter 130 reduces the output voltage fluctuations caused by switching of Ip and In. Ip and In should be equal to maintain a constant output voltage Vout and a constant frequency oscillation signal $f_{vco}$ from VCO 140. Otherwise, if the signal REF_IN and the signal VCO_IN are not in phase, the phase detector 110 changes the duty cycles of control signals CNTRL_P and CNTRL_N respectively to change the voltage Vout and change the frequency of oscillation of signal $f_{vco}$ from the VCO 140. For example, when the signal VCO_IN trails the reference input signal REF_IN, the duty cycle of control signal CNTRL_P is increased relative to the duty cycle of control signal CNTRL_N. The increased duty cycle increases the duration of Ip, charges the node 125, increases the voltage Vout, and increases the oscillation frequency of signal $f_{vco}$ from VCO 140.

Traditionally, in a CMOS charge pump, the transistor 122 and current source 124 are P channel devices because P channel transistors handle the supplied voltage Vdd better, and the transistor 128 and current source 126 are N channel devices because N channel devices handle the reference voltage Vss better. In FIG. 1, there is problem with regard to the current feedthrough issue but the noise immunity capability is better.

As aforementioned, currents Ip and In increase and decrease in response to the control signals in a manner characteristic of P channel devices 122 and 124 and N channel devices 126 and 128 respectively. However, it is not likely to have a perfect match response of P channel devices and N channel devices. For example, even when the phase detector 110 provides control signals of equal duty cycle to the transistors 122 and 128, a net current Ic flows to the node 125 and increases the voltage Vout. VCO 140 would then be driven to oscillate faster, and the signal VCO_IN becomes out of phase with the reference signal REF_IN. Phase detector 110 would in turn change the control signals CNTRL_P and CNTRL_N and decreases voltage Vout until signals VCO_IN and REF_IN are in phase again. Once signals VCO_IN and REF_IN are in phase, the control signals CNTROL_P and CNTRL_N are of equal duty cycle, and voltage Vout rises again as described above. Voltage increases and decreases repeatedly in this manner causing jitters in the signal $f_{vco}$ provided by VCO 140.

Furthermore, the charging and discharging current are controlled by one corresponding switch. Thus, the charging or discharging current is turned off when the corresponding switch is off. Thereafter, when the charging or discharging is turned on by the corresponding switch, a charge feedthrough will occur and the switching speed is slowed down to stabilize the charging or discharging current. This in turn causes a significant fluctuation of the output voltage Vout as shown in FIG. 2(a). Besides, the duty cycle of the output waveform is not going to be a desired 50% as shown in FIG. 2(b). The jitters and the unbalanced output waveform may be unacceptable in applications where a precise timing or a high-frequency clock signal is a demand.

Referring to a prior art of "A low jitters 0.3–165 MHz CMOS PLL Frequency Synthesizer for 3V/5V Operation" by Howard C. Yang et al., on IEEE Journal of Solid State Circuits, 1997, there are two switches to control the charging current and another two switches to control the discharging current. Therefore, the charging and discharging currents of Howard C. Yang et al. can always be kept on, and the circuit can work smooth at high speed. However, Howard C. Yang et al. make use of a current-steering amplifier (CSA) to keep the output voltage of charging/discharging device at the same voltage level, which results in a complex circuit and demands a larger chip area.

SUMMARY OF THE INVENTION

It is therefore an object of the invention to provide a charge pump with no charge feedthrough at the switching period activated by the phase detector to achieve a good performance at high speed.

In accordance with an embodiment of this invention, a charge pump circuit comprising a charging transistor, a discharging transistor, a first pair of switching transistors, a first pair of transistors, a second pair of switching transistors, a second pair of transistors, a constant current source, a filter, and a quick-charge-switching transistor is provided. The charging transistor may be a p-channel field effect transistor (FET), and the discharging transistor may be a matched n-channel FET.

The constant current source provides a first constant current and a second constant current.

The charging transistor, responsive to the first constant current, provides a charging current, and the charging transistor has a drain node.

The discharging transistor, responsive to the second constant current, provides a discharging current, and the discharging transistor has a drain node.

The first pair of switching transistors, respectively connected the charging transistor at the drain node thereof and responsive to a first pair of complementary control signals, selectively conducts the charging current.

Each of the first pair of the transistors is coupled to respective one of the first pair of switching transistors for conducting the charging current to the output terminal. Each of the first pair of transistors is controlled by the output voltage and is set to operate in saturation region such that a voltage of the drain node of the charging transistor keeps a substantially constant value during transition of the first pair of complementary control signals.

The second pair of switching transistors, respectively connected the discharging transistor and responsive to a second pair of complementary control signals, selectively conducts the discharging current.

Each of the second pair of the transistors is coupled to respective one of the second pair of switching transistors for conducting the discharging current to a reference ground. Each of the second pair of transistors is controlled by the output voltage and is set to operate in saturation region such that a voltage of the drain node of the discharging transistor keeps a substantially constant value during transition of the second pair of complementary control signals.

A charge pump in accordance with this embodiment may be coupled to a phase detector in a phase-locked loop. The dimensions of the first pair and the second pair of switching transistors are selected so that all the transistors are of the same transient responses. Consequently, when the phase detector provides matched pairs of complementary control signals (signals with equal duty cycle, frequency, and phase) for the first and the second pairs of switching transistor, the charge pump produces matched charging and discharging current pulses that increase at about the same rate while being switched on, decrease at about the same rate while being switched off. Jitters in phase-locked loops caused by prior art charge pumps with unequal charging and discharging current pulses by unmatched transient response is further reduced.

Another embodiment of the invention is a phase-locked loop comprising a phase detector, a voltage-to-voltage converter, a delay cell chain, and a charge pump in accordance with the embodiments above.

Still another embodiment of the invention is a frequency synthesizer comprising a phase detector, a double frequency converter, a voltage-to-voltage converter, a delay cell chain, and a charge pump in accordance with the embodiments above.

Still another embodiment of the invention is a phase-locked loop comprising a phase detector, a voltage controlled oscillator, and a charge pump in accordance with the embodiments above.

BRIEF DESCRIPTION OF THE DRAWINGS

Other objects, features, and advantages of the invention will become apparent from the following detailed description of the preferred but non-limiting embodiments. The description is made with reference to the accompanying drawings in which:

FIG. 4(a) shows an output voltage of the charge pump in accordance with this invention.

FIG. 4(b) shows an output clock signal of a frequency synthesizer in accordance with this invention.

DESCRIPTION OF THE PREFERRED EMBODIMENTS

Figure 1:
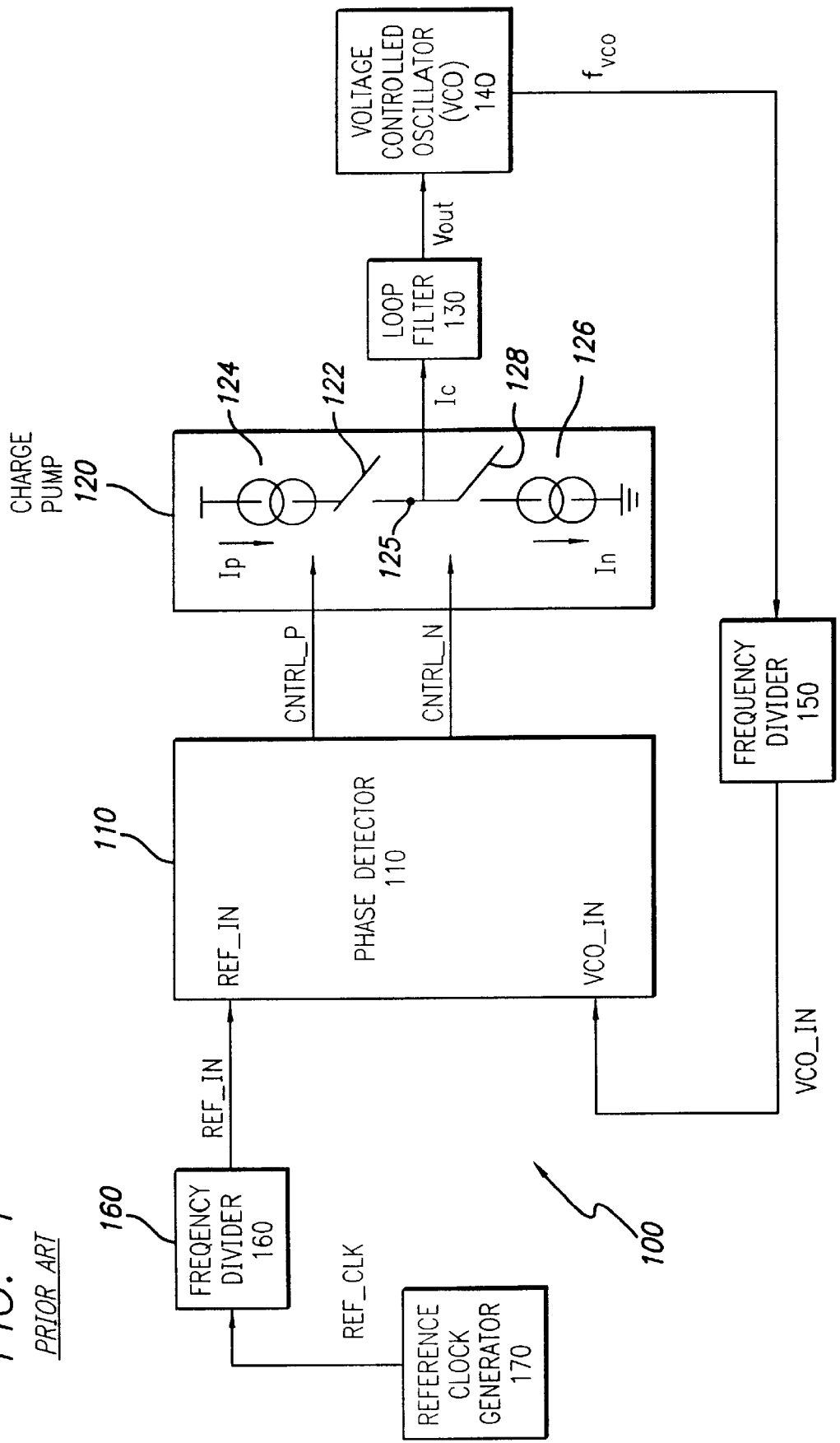
FIG. 1 shows a block diagram of a prior art frequency synthesizer 100 including a charge pump.
Figure 2:
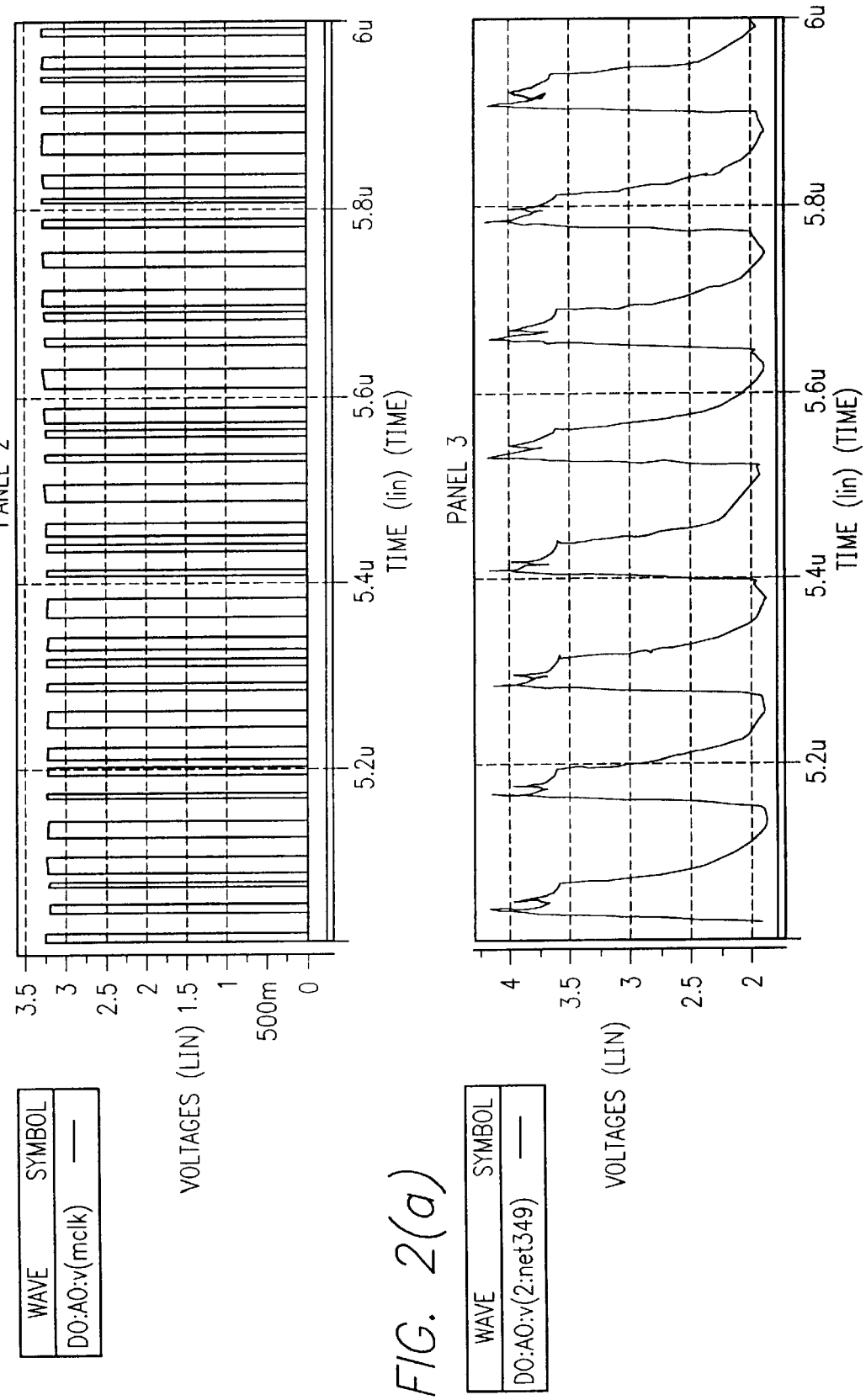
FIG. 2(a) shows a typical output voltage of the charge pump in the prior art.
FIG. 2(b) shows a typical output clock signal of a frequency synthesizer in the prior art.
Figure 3:
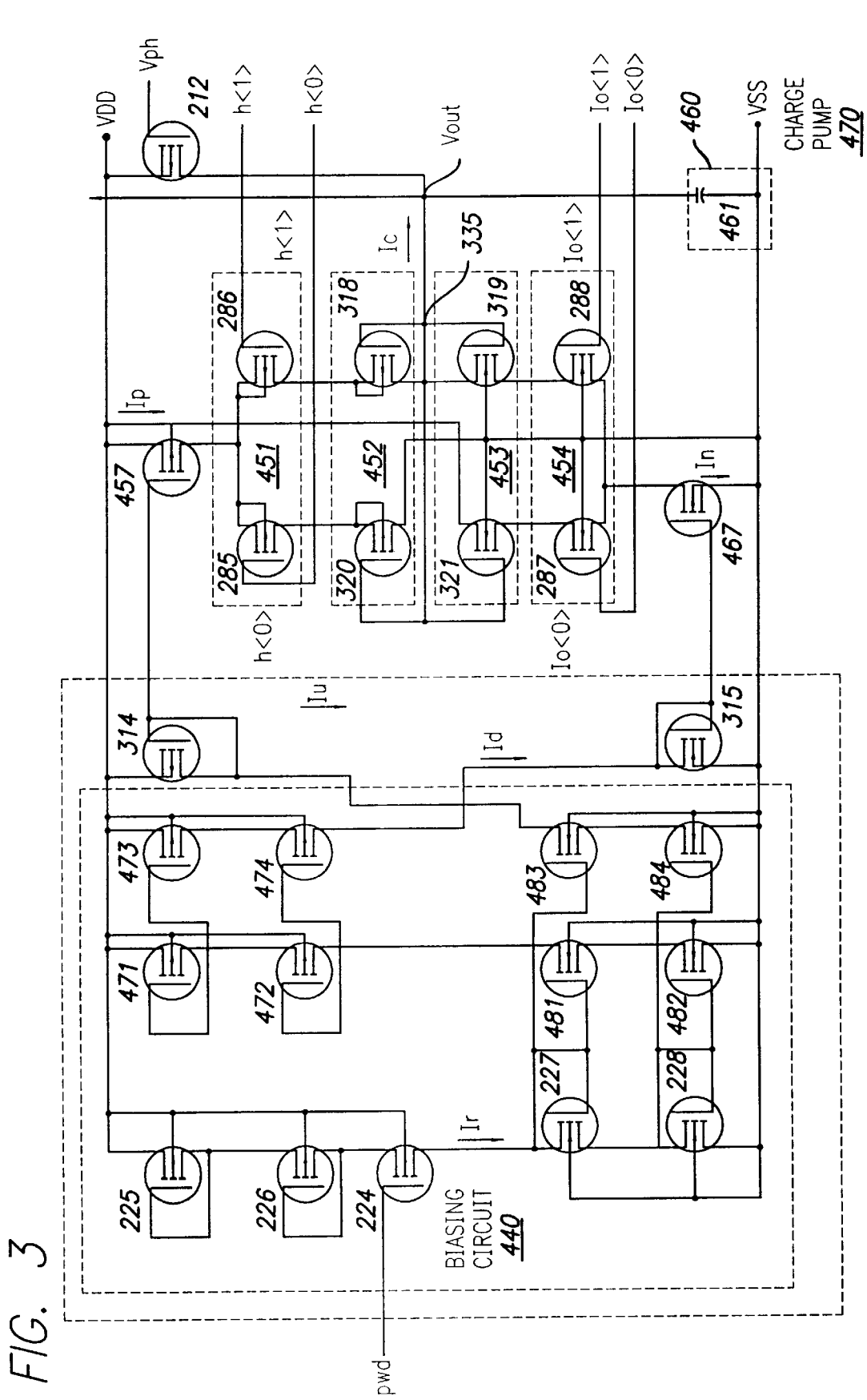
FIG. 3 is a circuit diagram of a charge pump 470 in accordance with an embodiment of this invention.

FIG. 3 shows a circuit diagram of a charge pump 470 in accordance with an embodiment of this invention. The charge pump 470 comprises a constant current source 450, a charging transistor 457, a discharging transistor 467, a first pair of switching transistors 451, a first pair of transistors 452, a second pair of switching transistors 454, a second pair of transistors 453, a filter 460, and a quick-charges-witching transistor 212. In the constant current source 450, a biasing circuit 440 is provided. In biasing circuit 440, a power-down transistor 224 is provided to input a power-down signal pwd. When the power-down signal pwd is active, the constant current source 450 is kept in a power-saving mode and the currents in the constant current source 450 are off.

The constant current source is operative to provide a first constant current Iu and a second constant current Id. The charging transistor 457 is operative to, responsive to the first constant circuit Iu, provide a charging current Ip. The discharging transistor 467 is operative to, responsive to the second constant circuit Id, provide a discharging current In. The first pair of switching transistors (285, 286) are operative to, responsive to a first pair of complementary control signals (h<1>,h<0>), selectively conduct the charging current Ip. The second pair of switching transistors (287, 288) are operative to, responsive to a second pair of complementary control signals (lo<1>,lo<0>), selectively conduct the discharging current In The first pair of transistors (318, 320) are operative to conduct the charging current Ip to the output terminal of the charge pump or to VSS and, at the same time, keeps the voltage of the drain node of the charging transistor 457 at a substantial constant value during transition of the first pair of complementary control signals. The second pair of transistors (319, 321) are operative to conduct the discharging current In from the output node of the charge pump or from VDD and, at the same time, keeps the voltage of the drain node of the discharging transistor 467 at a substantial constant value during transition of the second pair of complementary control signals. The filter 460 functions to smooth the waveform of output voltage Vout while the complementary control signals are being switched. The quick-charge-switching transistor 212 functions to fast charge the output terminal of the charge pump to VDD.

The gates of the charging transistor 457 and the discharging transistor 467 are coupled to the constant current source 450. The first pair of switching transistors 451 consists of a first switching transistor 286 and a second switching transistor 285. The sources of the first switching transistor 286 and the second switching transistor 285 are coupled together to the drain of the charging transistor 457. The second pair of switching transistor 454 consists of a first switching transistor 288 and a second switching transistor 287. The sources of the first switching transistor 288 and the second switching transistor 287 are coupled together to the drain of the discharging transistor 467. The first pair of transistors 452 consist of a transistor 318 and a second transistor 320. The second pair of transistors 453 consist of a first transistor 319 and a second transistor 321.

The first transistor 318 is connected in active-load mode with its gate and drain connected together. The source of the first transistor 318 is connected to the drain of the first transistor 286. The first transistor 319 is connected in active-load mode with its gate and drain connected together. The source of the first transistor 319 is connected to the drain of the first transistor 288. The drains of the first transistor 318 and the first transistor 319 are coupled together to form an output node 335 of the charge pump circuit 470.

The second transistor 320 is coupled in series between a reference potential VSS and the drain of the second transistor 285. The second transistor 321 is coupled in series between a supply voltage VDD and the drain of the second transistor 287. The second transistor 320 is connected in active-load mode. The source of the second transistor 320 is connected to the drain of the first transistor 285. The second transistor 321 is connected in active-load mode. The source of the second transistor 321 is connected to the drain of the second transistor 287. The gates of the second transistor 320 and the second transistor 321 are connected together and are coupled to the output node 335 of the charge pump circuit 470. The quickcharge-switching transistor 212 is coupled between the supply voltage VDD and the output node 335 of the charge pump circuit 470.

The constant current source 450 comprises a biasing circuit 440, a first mirror transistor 314, and a second mirror transistor 315. The biasing circuit 440 provides a bias voltage such that the first mirror transistor 3,14 and the second mirror transistor 315 both operates in linear region. The first mirror transistor 314 operates to bias the charging transistor 457. The second mirror transistor 315 operates to bias the discharging transistor 467.

The first mirror transistor 314 is connected in active-load mode with its gate and drain connected together. The first mirror transistor 314 is coupled in series between the supply voltage VDD and the biasing circuit 440. The biasing circuit 440 also comprises a power-down transistor 224 and several biasing transistors as shown in the figure.

The second mirror transistor 315 is connected in active-load mode with its gate and drain connected together. The second mirror transistor 315 is coupled in series between the reference potential VSS and the biasing circuit 440. The gates of the first mirror transistor 314 and the charging transistor 457 are coupled together, and the gates of the second mirror transistor 315 and the discharging transistor 467 are coupled together.

The filter 460 comprises a filter capacitor 461. The filter capacitor 460 is coupled between the output node 335 and the reference potential VSS.

The fast-charging signal Vph enables the fast charging mode of the charge pump 470. A first pair of complementary control signals h<0> and h<1> selects one transistor of the first pair of switching transistors 451 to conduct the charging current Ip. A second pair of complementary control signals lo<0> and lo<1> selects one transistor of the second pair of switching transistors 454 to conduct the discharging current In. Those signals may be generated by a phase detector circuit 420 shown in FIG. 5.

Figure 5:
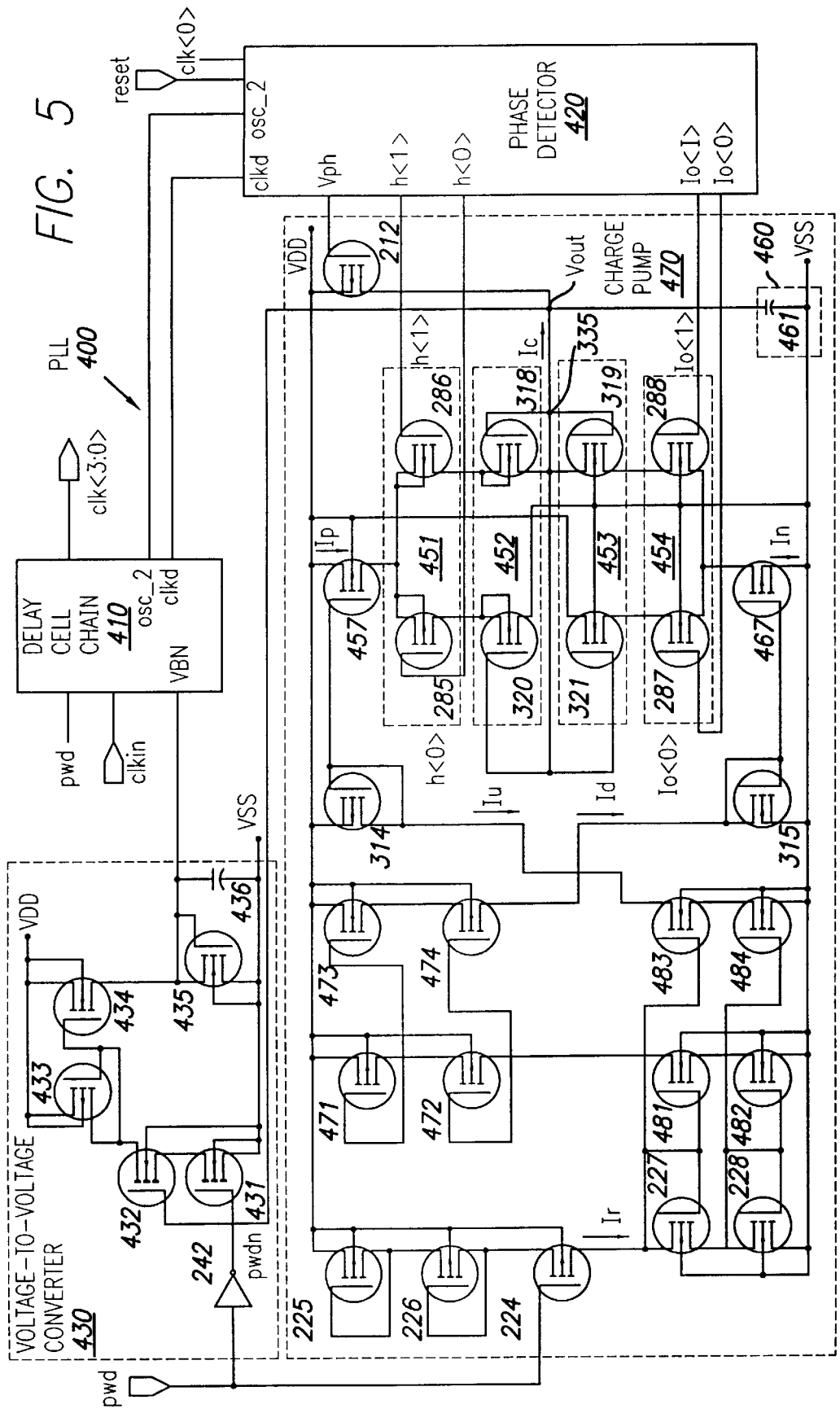
FIG. 5 shows a diagram of a phase-locked loop which includes a delay cell chain 410, a phase detector 420, a voltage-to-voltage converter 430, and the charge pump 470 in accordance with the embodiment of FIG. 3.

The charge pump 470 thereof provides an output voltage Vout to a circuit (not shown in FIG. 3), i.e. a voltage-to-voltage converter 430 shown in FIG. 5. The output voltage Vout depends on the difference between a charge current Ip which flows into the node 335 and a discharge current In which flows out of the node 335. Thus, when maintaining a constant output voltage Vout, the charging current Ip and the discharging current In are kept equal. The first and second pairs of switching transistors 451, 454 are selected so that they have matched capacitance and switch at nearly the same rate.

In other words, the first pair of complementary control signals h<0> and h<1> controls the first pair of switching transistors 451 to switch between a charging path and a standby path for the charging current Ip. The charging path is the path which Ip current flows from the applied voltage VDD to the output terminal 335.

In other words, the second pair of complementary control signals lo<0> and lo<1> controls the second pair of switching transistors 454 to switch between a discharging path and a standby path for the discharging current In. The discharging path is the path which current In flows from the filter capacitor 461 to the reference potential VSS.

The first pair of transistors 452 and the second pair of transistors 453 are used to fix the drain voltage of the charging transistor 457 and discharging transistor 467 and, in conjunction with the first and the second pairs of switching transistors 451, 454, are used to keep the charging current and the discharging current always on. The filter 460 smoothes the waveform of output voltage Vout while the complementary control signals are being switched.

The quick-charge-switching transistor 212 provides a fast charging mode for the output voltage Vout to get value of VDD. The biasing circuit 440 sets a constant current Iu to the first mirror transistor 314 and another constant current Id to the second mirror transistor 315. The charging transistor 457 is mirror biased by the first mirror transistor 314 to get the constant current Ip as charging current. The discharging transistor 467 is mirror biased by the second mirror transistor 315 to get the constant current In as discharging current. The transistors 225, 226, 227 and 228 act to provide a reference current Ir of the biasing circuit 440. Transistors 481, 482, 483 and 484 act to provide the first mirror transistor 314 with a current Iu . Transistors 471, 472, 473, 474 act to provide the second mirror transistor 315 with a current Id . Therefore, the biasing transistors in the biasing circuit 440 are utilized to provide stable biasing currents Iu and Id for the constant current source 450. The gate of the power-down transistor 224 in the biasing circuit 440 is coupled to a power down signal pwd. When the power down signal pwd is active, the constant current source 450 is kept in a power-saving mode and the currents in the constant current source 450 are off.

Accordingly, no matter the first pair of complementary control signals h<0> and h<1> is set at either state, the charging transistor 457 is always on, which means the mirrored charging current is always. Still, no matter the second pair of complementary control signals lo<0> and lo<1> is set at either state, the discharging transistor 467 is always on, which means the mirrored discharging current is always on. The continuity of the charging and the discharging currents in the charging transistor 457 and the discharging transistor 467 means that no switching operation occurs in the two transistors 457 and 467, and any disadvantage caused by the unmatched transient responses of the two transistors 457 and 467 is reduced significantly. Furthermore, the first pair of transistors 452 can keep unchanged the drain voltage of the charging transistor 457 and the second pair of transistors 453 can keep unchanged the drain voltage of the discharging transistor 467. Therefore, the fluctuation of the output voltage Vout is much smaller than that of the prior art as shown in FIG. 4(a) and the duty cycle of output waveform is nearly 50% as shown in FIG. 4(b). Therefore, the switching performance is much better than the prior arts and the circuit can operate in much higher frequency.

In addition, the charge feedthrough, the jitters, and the unbalanced output waveform is not going to be significant in the charge pump circuit of the present invention. Bedsides, the matched characteristics of the transistors 457 and 467 in conjunction with the matched electrical performance of the paired transistors 451 and 454 is supposed to further reduce those unwanted effects.

FIG. 5 shows a typical application of charge pump 470 in a phase-locked loop 400. The phase-locked loop 400 comprises a phase detector 420, a voltage-to-voltage converter 430, a delay-cells chain 410, and a charge pump 470 in accordance with the embodiments above. The voltage-to-voltage converter 430 comprises an inverter 242, a power-down transistor 431, a regulating capacitor 436, and some converting transistors 432, 433, 434 and 435. The inverter 242 inverts the power-down signal pwd into another power-down signal pwdn for the n-channel power-down transistor 431. When the power-down signal pwdn is active, the voltage-to-voltage converter 430 is kept in a power-saving mode and the currents in the constant current source 450 are off. When the power-down signal pwdn is in-active, the transistor 431 is used as an active resistor. The converting transistors 432 converts the output voltage Vout of the charge pump 470 into a current. Through transistors 433 to 435, this current is then converted into a control voltage VBN for the delay cells chain 410. The regulating capacitor 436 operates to remove the fluctuation or noise in the control voltage VBN. The well known delay cells chain 410 may comprise, i.e., four delay cells, not shown in the figure, connected in series and each delay cell has same delay time controlled by VBN. The control voltage VBN to the delay cells chain 410 is converted into a current to control the delay time of each delay cell therein. The power-down signal pwd to the delay cells chain 410 keeps the delay cells chain 410 in a power-saving mode. The input clock signal, clkin, to the delay cells chain 410 is a clock signal to be locked in the phase-locked loop 400. There are four output signals, clk<0:3>, corresponding to outputs of the four delay cells within the delay cells chain 410. While the clock signal, clkin, is locked in the phase-locked loop 400, the clock signal, clk<0>, lags the input clock signal clkin with a phase shift of 90°. The clock signal clk<1> lags the input clock signal clkin with a phase shift of 180°. The clock signal clk<2> lags the input clock signal clkin with a phase shift of 270°. And the clock signal clk<3> is in phase with the input clock signal clkin or with a phase shift of 360°.

The clkd is a signal resulting from a buffer operation of the clkin signal. The OSC_2 signal is a signal resulting from a buffer operation of the clk<3> signal. For instance, the buffer operation may involve two successive inverting gates.

Another two output clock signals, i.e., the clkd and OSC_2, of the delay cells chain 410 are input to the phase detector 420 for signal comparison. The reset input signal to the phase detector 420 acts to reset the phase detector 420. When the phase shift between the clock clk<0> and clkin is out of the locking range of the phase-lock loop 400, the input clock signal, clk<0>, to the phase detector 420 activates the fast-charging signal Vph to enable the fast charging mode of the charge pump 470. Two output pairs of complementary control signals h<0:1> and lo<0:1> of the phase detector 420 act to control the two pairs of switching transistors 451 and 454 of the charge pump 470.

As the system is powered on, the reset signal is generated which resets the phase detector 420, i.e. h<1>=1, h<0>=0, lo<1>=0, lo<0>=1. At this point, the phase detector begins to detect the rising edge of the clkd and OSC_2.

If the rising edge of clkd is detected first which represents an over-delay condition within the delay cells chain 410, the phase detector 420 accordingly sets h<1>=0, h<0>=1 which renders charge action of the charge pump 470. The charge action continues until the rising edge of OSC_2 is detected at which point the phase detector 420 is reset to begin detecting the rising edge of the clkd and OSC_2.

If the rising edge of OSC_2 is detected first which represents an under-delay condition within the delay cells chain 410, the phase detector 420 accordingly sets lo<1>=1, lo<0>=0 which renders discharge action of the charge pump 470. The discharge action continues until the rising edge of clkd is detected at which point the phase detector 420 is reset to begin detecting the rising edge of the clkd and OSC_2.

The following measures are taken to avoid the mislocking operation of the phase lock loop 400 when the delay amount of clk<3> equals to N×360°, where N >2, i.e. over two cycles. The falling edge of clkd is used to sense the clk<0>. As the sensed value of clk<0> is high which represents the delay amount of clk<3> being less than two cycles, the phase detector 420 is not reset. As the sensed value of clk<0> is low which represents the delay amount of clk<3> being more than two cycles, the phase detector 420 is reset and the Vph is set to low. As Vph is set to low, the output Vout of the charge pump 470 has a highest value which makes the delay amount of clk<3> be less than 360°. At this moment, the phase lock loop 400 commences to lock frequency again.

Figure 6:
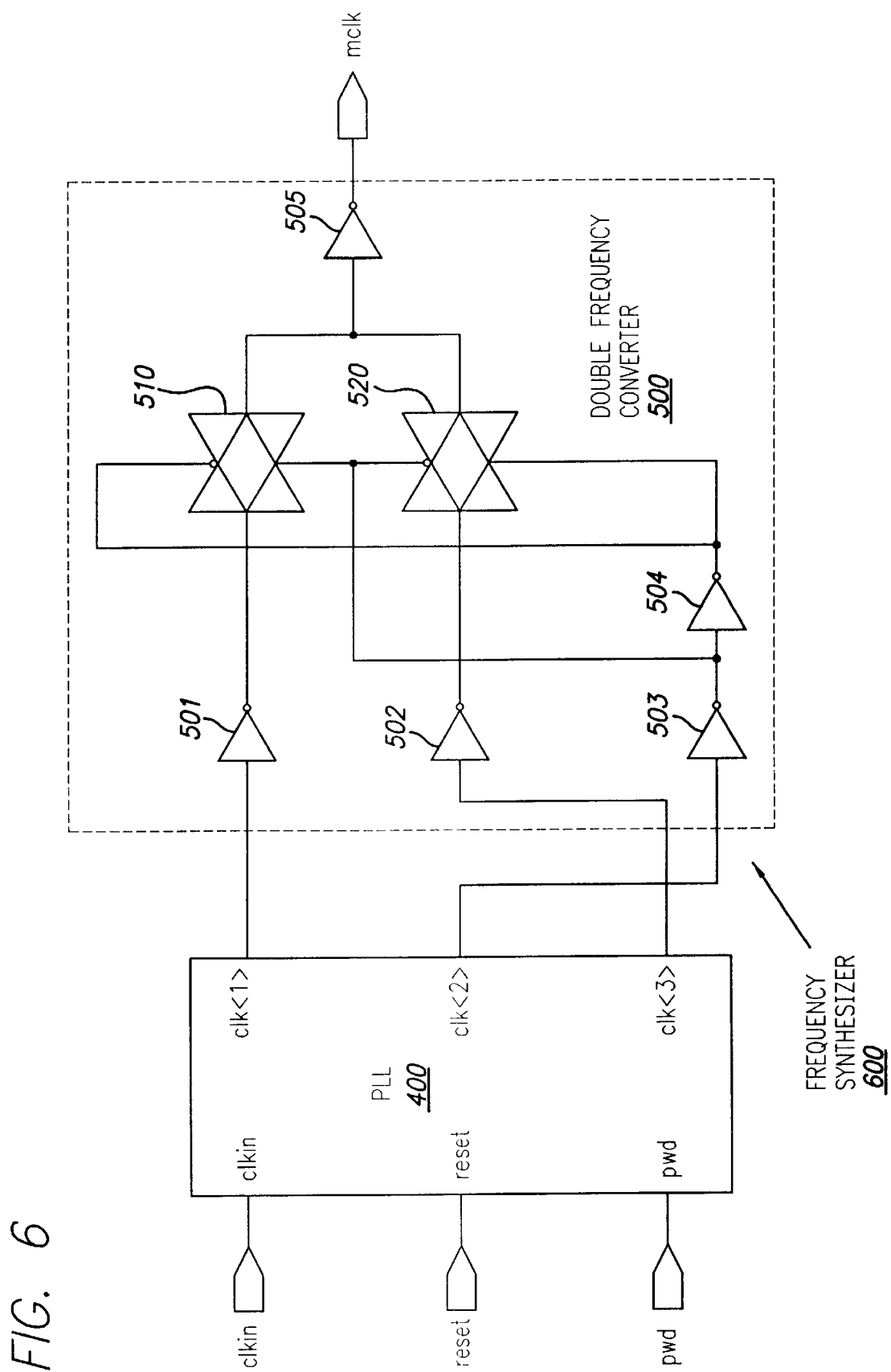
FIG. 6 shows a diagram of a frequency synthesizer which include a double frequency converter 500, and the phase-locked loop 400 in accordance with the embodiment of FIG. 5.

FIG. 6 shows a typical application of phase-locked loop 400 in a frequency synthesizer 600. The frequency synthesizer 600 comprises a well known double frequency converter 500, and a phase-locked loop 400 in accordance with the embodiment above. The double frequency converter 500 comprises four inverters 501, 502, 503, 504 and 505 and two CMOS transmission gates 510 and 520. The well-known double frequency converter 500 utilizes the three phase-shift clock signals clk<1:3> to generate an output clock signal mclk with a frequency double that of input phase-shift clock signals clk<1:3>.

The present invention has been described with some preferred embodiments. However, anyone who is skilled in the arts is likely to make various modifications and equivalent arrangements within the scope of the present invention. For example, the followings illustrate some possible alternatives according to the present invention.

Alternatively, in one embodiment, filter 460 of the charge pump 470 in FIG. 3 comprises a first capacitor, a second capacitor, and a resistor. The first capacitor is connected between output node 335 and system ground VSS. The second capacitor and the resistor are connected in series between output node 335 and system ground VSS. Using filter to smooth a voltage waveform is well known in the art, and a many other types of filter may be used in place of filter 460.

Alternatively, in one embodiment, the constant current source 450 of the charge pump 470 in FIG. 3 may include another first capacitor and another second capacitor. The first capacitor is coupled between the gate of the first mirror transistor 314 and supply voltage VDD. The second capacitor is coupled between the gate of the second mirror transistor 315 and system ground VSS. The first and second capacitors act to reduce the jitters caused by fluctuations in supply voltage VDD and system ground VSS.

Alternatively, in one embodiment, a phase-locked loop comprises a phase detector, a voltage controlled oscillator, and a charge pump in accordance with the embodiment above.

It is thereof to be understood that the scope of the present invention need not be limited to the disclosed preferred embodiments. On the contrary, it is intended to cover various modifications and equivalent arrangements within the scope defined in the following appended claims. The scope of the claims should be accorded the broadest interpretation so as to encompass all such modifications and equivalent arrangements.

What is claimed is:

1. A charge pump comprising:
   an output terminal for generating an output voltage;
   a constant current source for providing a first constant current and a second constant current;
   a charging transistor, responsive to the first constant current, for providing a charging current, the charging transistor having a drain node;
   a discharging transistor, responsive to the second constant current, for providing a discharging current, the discharging transistor having a drain node;
   a first pair of switching transistors, respectively connected to the charging transistor at the drain node thereof and responsive to a first pair of complementary control signals, for selectively conducting the charging current;
   a first pair of transistors, each of the first pair of the transistors being coupled to respective one of the first pair of switching transistors for conducting the charging current to the output terminal, each of the first pair of transistors being controlled by the output voltage and being set to operate in saturation region such that a voltage of the drain node of the charging transistor keeps a substantially constant value during transition of the first pair of complementary control signals;
   a second pair of switching transistors, respectively connected to the discharging transistor and responsive to a second pair of complementary control signals, for selectively conducting the discharging current; and
   a second pair of transistors, each of the second pair of the transistors being coupled to respective one of the second pair of switching transistors for conducting the discharging current to a reference ground, each of the second pair of transistors being controlled by the output voltage and being set to operate in saturation region such that a voltage of the drain node of the discharging transistor keeps a substantially constant value during transition of the second pair of complementary control signals.

2. The charge pump according to claim 1, wherein the charging transistor is a p-channel field effect transistor (FET).

3. The charge pump according to claim 1, wherein the discharging transistor is a n-channel FET.

4. The charge pump according to claim 1, wherein the first pair of switching transistors comprising:
   a first switching transistor having a source coupled to the charging transistor and a gate coupled to one of the first pair of complementary control signals; and
   a second switching transistor having a source coupled to the charging transistor and a gate coupled to one of the first pair of complementary control signals.

5. The charge pump according to claim 1, wherein the second pair of switching transistor comprising:
   a first switching transistor having a source coupled to the discharging transistor and a gate coupled to one of the second pair of complementary control signals; and
   a second switching transistor having a source coupled to the discharging transistor and a gate coupled to one of the second pair of complementary control signals.

6. The charge pump according to claim 1, wherein the first pair of transistor comprising:
   a first transistor having a gate coupled to an output node and connected in series between the first switching transistor and the output node; and
   a second transistor having a gate coupled to an output node and connected in series between the second switching transistor and the second voltage terminal.

7. The charge pump according to claim 1, wherein the second pair of transistor comprising:
   a first transistor having a gate coupled to an output node and connected in series between the first switching transistor and the output node; and
   a second transistor having a gate coupled to an output node and connected in series between the second switching transistor and the first voltage terminal.

8. The charge pump according to claim 1, wherein further comprises a filter coupled between the output node and the second voltage terminal.

9. The charge pump according to claim 1, wherein further comprises a quick-charge-switching transistor coupled between the first voltage terminal and the output node.

10. The charge pump according to claim 8, wherein the filter comprises a filter capacitor coupled between the output node and the second voltage terminal.

11. The charge pump according to claim 8, wherein the filter comprises:
    a first capacitor coupled between the output node and the second voltage terminal between the output node and the second voltage terminal;
    a second capacitor; and
    a resistor connected in series with the second capacitor between the output node and the second voltage terminal.

12. The charge pump according to claim 9, wherein the quick-charge-switching transistor is a p-channel FET.

13. The charge pump according to claim 1, wherein the constant current source comprises:
    a biasing circuit;
    a first mirror transistor coupled in series between the biasing circuit and the first voltage terminal with a gate connected to the gate of the charging transistor; and
    a second mirror transistor coupled in series between the biasing circuit and the first voltage terminal with a gate connected to the gate of the discharging transistor.

14. The charge pump according to claim 13, wherein the constant current source further comprises a first capacitor coupled between the gate of the first mirror transistor and the first voltage terminal.

15. The charge pump according to claim 13, wherein the constant current source further comprises a second capacitor coupled between the gate of the second mirror transistor and the second voltage terminal.

16. A phase-locked loop comprising:
a phase detector for generating a first pair of complementary control signals and a second pair of complementary control signals;
a voltage-to-voltage converter;
a delay cell chain; and
a charge pump comprising:
an output terminal for generating an output voltage;
a constant current source for providing a first constant current and a second constant current;
a charging transistor, responsive to the first constant current, for providing a charging current, the charging transistor having a drain node;
a discharging transistor, responsive to the second constant current, for providing a discharging current, the discharging transistor having a drain node;
a first pair of switching transistors, respectively connected to the charging transistor at the drain node thereof and responsive to the first pair of complementary control signals, for selectively conducting the charging current;
a first pair of transistors, each of the first pair of the transistors being coupled to respective one of the first pair of switching transistors for conducting the charging current to the output terminal, each of the first pair of transistors being controlled by the output voltage and being set to operate in saturation region such that a voltage of the drain node of the charging transistor keeps a substantially constant value during transition of the first pair of complementary control signals;
a second pair of switching transistors, respectively connected to the discharging transistor and responsive to the second pair of complementary control signals, for selectively conducting the discharging current; and
a second pair of transistors, each of the second pair of the transistors being coupled to respective one of the second pair of switching transistors for conducting the discharging current to a reference ground, each of the second pair of transistors being controlled by the output voltage and being set to operate in saturation region such that a voltage of the drain node of the discharging transistor keeps a substantially constant value during transition of the second pair of complementary control signals; wherein
the voltage-to-voltage converter, responsive to the output voltage, for generating a delay-time control signal to the delay cell chain.

17. The phase-locked loop according to claim 16, wherein the charge pump further comprising a filter coupled between the output node and the second voltage terminal.

18. The phase-locked loop according to claim 16, wherein the charge pump further comprising a quick-charge-switching transistor coupled between the first voltage terminal and the output node.

19. The phase-locked loop according to claim 17, wherein the filter comprising a filter capacitor coupled between the output node and the second voltage terminal.

20. The phase-locked loop according to claim 17, wherein the filter comprising:
a first capacitor coupled between the output node and the second voltage terminal between the output node and the second voltage terminal;
a second capacitor; and
a resistor connected in series with the second capacitor between the output node and the second voltage terminal.

21. The phase-locked loop according to claim 18, wherein the quick-charge-switching transistor is a p-channel FET.

22. The phase-locked loop according to claim 16, wherein a dimension of the charge transistor and a corresponding dimension of the discharging transistor equalize the currents mirrored from the constant current source.

23. A frequency synthesizer comprising:
a frequency converter;
a phase detector;
a voltage-to-voltage converter;
a delay cell chain, responsive to an input clock signal, for generating a plurality of signals each has a predetermined phase difference with respect to the input clock signal;
a charge pump comprising:
an output terminal for generating an output voltage;
a constant current source for providing a first constant current and a second constant current;
a charging transistor, responsive to the first constant current, for providing a charging current, the charging transistor having a drain node;
a discharging transistor, responsive to the second constant current, for providing a discharging current, the discharging transistor having a drain node;
a first pair of switching transistors, respectively connected to the charging transistor at the drain node thereof and responsive to a first pair of complementary control signals, for selectively conducting the charging current;
a first pair of transistors, each of the first pair of the transistors being coupled to respective one of the first pair of switching transistors for conducting the charging current to the output terminal, each of the first pair of transistors being controlled by the output voltage and being set to operate in saturation region such that a voltage of the drain node of the charging transistor keeps a substantially constant value during transition of the first pair of complementary control signals;
a second pair of switching transistors, respectively connected to the discharging transistor and responsive to a second pair of complementary control signals, for selectively conducting the discharging current; and
a second pair of transistors, each of the second pair of the transistors being coupled to respective one of the second pair of switching transistors for conducting the discharging current to a reference ground, each of the second pair of transistors being controlled by the output voltage and being set to operate in saturation region such that a voltage of the drain node of the discharging transistor keeps a substantially constant value during transition of the second pair of complementary control signals; and
a voltage-to-voltage converter, responsive to the output voltage, for generating a delay-time control signal to the delay cell chain; and wherein
the frequency converter, responsive to the plurality of signals from the delay cell chain, outputs a clock signal with a frequency different from frequency of the plurality of signals.

24. The frequency synthesizer according to claim 23, wherein the frequency converter is a double frequency converter.

* * * * *